(12) United States Patent
Krechting

(10) Patent No.: US 8,773,227 B2
(45) Date of Patent: Jul. 8, 2014

(54) METHOD FOR FABRICATING AN ELECTROMAGNETIC ACTUATOR, AN ELECTROMAGNETIC ACTUATOR, AND A CHARGED PARTICLE DEVICE COMPRISING THE SAME

(75) Inventor: Petrus Theodorus Krechting, Enschede (NL)

(73) Assignee: Tecnotion B.V., Almelo (NL)

( * ) Notice: Subject to any disclaimer, the term of this patent is extended or adjusted under 35 U.S.C. 154(b) by 123 days.

(21) Appl. No.: 13/382,120

(22) PCT Filed: Jul. 1, 2010

(86) PCT No.: PCT/EP2010/059395
§ 371 (c)(1),
(2), (4) Date: Apr. 12, 2012

(87) PCT Pub. No.: WO2011/000927
PCT Pub. Date: Jan. 6, 2011

(65) Prior Publication Data
US 2012/0187309 A1    Jul. 26, 2012

(30) Foreign Application Priority Data
Jul. 3, 2009   (NL) ...................................... 2003128

(51) Int. Cl.
*H01H 53/015*   (2006.01)
*H01F 7/06*   (2006.01)

(52) U.S. Cl.
USPC ........................................... 335/148; 29/606

(58) Field of Classification Search
USPC ............ 335/229, 148; 29/854, 604, 606, 607
See application file for complete search history.

(56) References Cited

U.S. PATENT DOCUMENTS

| | | | | |
|---|---|---|---|---|
| 4,758,750 A | * | 7/1988 | Itagaki et al. | 310/13 |
| 4,808,955 A | * | 2/1989 | Godkin et al. | 335/222 |
| 5,345,206 A | * | 9/1994 | Morcos | 335/222 |
| 5,828,142 A | | 10/1998 | Simpson | |
| 6,787,943 B2 | * | 9/2004 | Godkin | 310/12.16 |
| 7,517,721 B2 | * | 4/2009 | Ito et al. | 438/106 |
| 2003/0106746 A1 | | 6/2003 | Grundmann | |

FOREIGN PATENT DOCUMENTS

EP    1699127 A1    9/2006

\* cited by examiner

*Primary Examiner* — Alexander Talpalatski
(74) *Attorney, Agent, or Firm* — Daniel G. Stoddard; Bret E. Field; Bozicevic, Field & Francis, LLP

(57) ABSTRACT

The present invention is related to a method for fabricating an electromagnetic actuator. It is further related to an electromagnetic actuator and a charged particle device comprising such an actuator. According to the present invention, the method for fabricating is characterized by determining an optimal allocation of permanent magnets to reduce the magnetic stray field caused by deviations between the nominal and actual magnetization values of the permanent magnets. The invention further provides a charged particle device comprising an electromagnetic actuator fabricated using the method according to the invention.

23 Claims, 5 Drawing Sheets

METHOD FOR FABRICATING AN ELECTROMAGNETIC ACTUATOR, AN ELECTROMAGNETIC ACTUATOR, AND A CHARGED PARTICLE DEVICE COMPRISING THE SAME

INTRODUCTION

The present invention is related to a method for fabricating an electromagnetic actuator. It is further related to an electromagnetic actuator and a charged particle device comprising such an actuator.

A charged particle device uses charged particles, such as ions or electrons, to inspect, characterize and or to process a target. An example of such a device is a scanning electron microscope (SEM) in which a beam of electrons is released from a cathode source towards a target which is arranged at a distance from the cathode source. These devices are frequently used for visualizing semiconductor devices in various stages of their development into a product. SEM images can for instance be used to detect defects in the semiconductor device.

Another example of an application of a charged particle device is electron beam lithography. This form of lithography uses an electron beam to write patterns in a lacquer layer which has been applied to the target, e.g. a semiconductor.

A focused ion beam etching apparatus is also an example of a charged particle device. In this apparatus a beam of ions is used to etch patterns in for instance a semiconductor.

Most charged particle devices comprise a holding unit for holding the target. An example is a wafer holder onto which a wafer can be placed. The holding unit should allow movement of the target with respect to the source of charged particles. In case of a SEM, this movement is needed to investigate different regions of the target.

Because a beam of charged particles is used, the magnetic field at the position of the beam should be minimized or at least constant and or predictable. The presence of a magnetic field causes the beam to deviate from its intended position due to the Lorentz force. Most prior art charged particle devices therefore employ non-magnetic actuators such as a walking piezo actuator. Other possibilities include a manually operable mechanical transmission.

In view of the ongoing trend to reduce the feature size of semiconductor devices, the requirements for the positional accuracy of the charged particle beam become ever more important. Furthermore, the defect size also reduces. Consequently, the need for inspection by SEM or another charged particle device increases because optical inspection no longer suffices. Another application which is desired in the near future is to be able to use direct e-beam writing on a production scale for reducing the feature size beyond the limits currently achievable by optical solutions.

At least some of these problems can be obviated by using electromagnetic actuators to move the holding unit. Linear motors, such as a linear synchronous motor (LSM), a stepper motor or a reluctance motor, can for instance be used as long as these motors are placed sufficiently far from the charged particle beam to prevent deflection thereof caused by the magnetic stray field emanating from the motor itself. To that end, a mechanical transmission is used between the holding unit and the linear motor which is placed at a distance from the holding unit. However, the inaccuracies induced by the tolerance of this mechanical transmission, as well as its inertia, prevent operation at high speeds with sufficient accuracy needed for next generation charged particle devices.

It should be noted that the term electromagnetic actuator encompasses more than just linear motors. Multi-axis actuators such as z-phi, planar, and floating planar electromagnetic actuators, both moving-magnet as moving-coil configurations, are also examples of electromagnetic actuators within the context of the present invention.

A linear motor, or an electromagnetic actuator in general, typically comprises a first and a second frame part. The first frame part is provided with an electric coil, whereas the second frame part has a plurality of predefined receiving positions for receiving a plurality of permanent magnets. By arranging the permanent magnets in the second frame part, a magnetic arrangement is obtained having an alternating pole pattern in a first direction. The first and second frame part can be coupled to each other. During operation, an electrical supply will drive the electric coil as a result of which a magnetic interaction will take place. This interaction can be in the form of a Lorentz force exerted on the coil by the magnetic field from the permanent magnets. The magnetic interaction causes a relative force, which can be used to control movement in the first direction. In a charged particle device, one of the first and second frame part is mechanically coupled to the holding unit.

SUMMARY

It is therefore an object of the present invention to provide a method for fabricating an electromagnetic actuator for which at least some of the above stated problems do not occur, or at least at a lesser degree. It is a further an object of the present invention to provide an 30 electromagnetic actuator which displays a sufficiently low magnetic stray field such that it can be directly coupled to a holding unit to eliminate the need for a mechanical coupling.

These objects are achieved with a method for fabricating an electromagnetic actuator according to the invention which is characterized by computing a correlation between an allocation of each of the plurality of permanent magnets to the plurality of receiving positions and the magnetic field at a first predefined interference point. This interference point could for instance correspond to a point in the pathway of charged particles when the electromagnetic actuator, such as a linear motor, is used in a charged particle device. Subsequently, the allocation is optimized with respect to a predetermined maximum value of the magnetic field at the first interference point using the correlation. Using the optimized allocation, each permanent magnet can be arranged in the receiving positions.

The applicant has found that the tolerance of the magnetization of the permanent magnets is the dominant factor why the magnetic stray fields of existing electromagnetic actuators, and linear motors in particular, cannot be reduced to satisfactory levels.

When designing a linear motor, finite element modeling techniques are most often used to compute the receiving positions and the associated magnetization of the magnets placed at these positions. Such a design is normally based on nominal magnetization values. In theory, the magnetic stray field should be according to the simulation results if the correct permanent magnets are used. However, several practical issues prevent the magnetic stray field to reach the simulated values. Firstly, the magnetization value of the permanent magnets is subjected to tolerance. There will always be a non-negligible deviation between the targeted design value, i.e. the nominal value, and the actual value. Moreover, these deviations generally occur in more than one direction, e.g. typically in three directions, and may depend on the specific location in the magnet. Secondly, the various components in the system, for instance ferromagnetic parts in the second and or first frame parts, display non-linear magnetic behavior which is difficult to model correctly.

The applicant has further realized that the deviations between the nominal values of the permanent magnets and their actual values result in magnetic multipoles of a relatively low order. These low order multipoles result in a magnetic field which decays with distance much slower than that of a high order multipole. It should be noted that a high order multipole arrangement is ordinarily the design target using the nominal magnetization of the permanent magnets.

It was further realized by the applicant that, given a set of permanent magnets, the allocation of these magnets can be optimized to reduce the strength of any low order multipole field. To that end the abovementioned correlation must be established. Such a correlation relates the magnetic field at the first reference point with the allocation of the permanent magnets in the receiving positions. Hence, given a certain allocation, the result of this allocation can be computed using the correlation. Furthermore, the correlation allows optimization with respect to certain design targets. For instance, a design target could be set corresponding to the maximum magnetic field at the first interference point. It should be noted that more than one interference point may be used. In addition, the number of receiving positions need not be equal to the number of permanent magnets to be placed. For instance, a number of 20 magnets may be available for only 16 positions.

The allocation should not only take into account which permanent magnet is placed at which receiving position, but also what the orientation of this magnet is. Typically, the permanent magnets are elongated structures extending along a longitudinal axis. Hence, the magnet could be rotated 180 degrees around this axis or it could be flipped, i.e. rotation of 180 degrees around an axis perpendicular to the longitudinal axis. Hence, the correlation provides a relationship between the magnetic field at the first interference point and the allocation of each of the permanent magnets and the orientation of these magnets at the respective receiving positions.

Within the context of the present application, the magnetization value for a permanent magnet should be interpreted as that magnetization value which, when distributed uniformly across the permanent magnet, would result in an identical magnetic field at a predefined position compared to the actual magnet.

Ordinarily, the nominal magnetization values for the magnetization of the plurality of permanent magnets are equal. Consequently, the correlation only needs to relate the various differences between the nominal value and the actual value for the magnetization of each of the plurality of permanent magnets. These differences are normally determined by measurement.

Having identical nominal magnetization values offers the possibility to linearize the magnetic field at the first interference point with respect to a difference between the nominal and actual value at each of the receiving positions. As such, the correlation can be written in matrix form. An example using four magnets is shown in equation 1.

$$H_x = H_{nom} + \begin{pmatrix} C11 & \ldots & \ldots & C14 \\ \ldots & \ldots & \ldots & \ldots \\ \ldots & \ldots & \ldots & \ldots \\ C41 & \ldots & \ldots & C44 \end{pmatrix} \times \begin{pmatrix} dif1 \\ dif2 \\ dif3 \\ dif4 \end{pmatrix} \quad \text{eq. 1}$$

wherein $H_x$ denotes the x-component of the magnetic field at the first interference point, $H_{nom}$ the magnetic field as a result of the nominal values of the magnetization, Cnn the components of the correlation, and difn the differences between the nominal and actual magnetization values. It should be noted that part of the orientation of the permanent magnets at a receiving positions, i.e. the direction of the magnetization, is normally fixed at the design stage. However, this does not prevent exchanging permanent magnets between different receiving positions and simultaneously change orientation.

The linearization is made possible because the deviations related to the tolerance of the magnetization are relatively small. Furthermore, because the nominal magnetization value is equal for the plurality of permanent magnets, any exchanging of magnets will not result in a change of the nominal magnetic field strength throughout the electromagnetic actuator and at the first interference position. In every position in the actuator and its surroundings the material properties and the magnetic and electric fields can be linearized. The working point of this linearization corresponds to the situation in which every permanent magnet has the nominal magnetization value. For instance, the second frame unit may comprise ferromagnetic material having a magnetic permeability that depends on the magnetic field strength. For small variations of the magnetic field strength around the working point, the permeability may be assumed constant. As a result, the magnetic field at the first interference position depends linearly on the various differences allocated to the various receiving positions. The resulting linear system allows for a fast optimization of the allocation.

Typically, an electromagnetic actuator comprises a periodic arrangement of permanent magnets. However, such an arrangement is finite. Due to this, the system would be unbalanced resulting in low order magnetic multipoles causing a relatively high magnetic stray field. Already in the design phase this effect can be accounted for. To this end, the magnetic field is calculated at a second predefined interference point using the nominal values for the magnetization of the plurality of permanent magnets. Usually, the magnetic arrangement comprising the plurality of permanent magnets is designed in order to generate a certain amount of force on the first frame part during operation with a required positional accuracy. As such, a nominal design for the electromagnetic actuator is established. In this design, one or more end receiving positions can be identified, either in the first and or the second frame part, for the placement of one or more end magnets. These magnets should cancel out the magnetic field caused by the inherent imbalance of the system. Given the calculated magnetic field, and the identified end receiving positions, the required magnetization value for the one or more end magnets for reducing the magnetic field at the second interference point can be calculated. After the calculation, the one or more end magnets, being a permanent magnet and or a powered electric coil, having a magnetization value in accordance with the calculated magnetization value can be arranged at the identified end receiving position.

It should be noted that the one or more end magnets may also be subjected to an allocation optimization. In case the nominal magnetization value for all end magnets is identical, a similar approach may be followed as with the permanent magnets previously described. Such optimization may be performed simultaneously with the optimization of the allocation of the permanent magnets. In that case, one can speak of a single allocation for the end magnets and the permanent magnets. Because the magnetization values for the end magnets usually differ from the permanent magnets, the position of different end magnets only relates to end receiving positions and the position of the permanent magnets only relates to receiving positions.

Unfortunately, the end magnet itself is subjected to tolerance, either in placement or in magnetization value. In addition, other factors like production tolerance and tolerances in other material properties may cause the resulting magnetic field at the first and or second interference point to be too high. It may therefore be required to apply additional correction or compensation.

Additional compensation may be achieved by measuring the magnetic field at a third interference point. One or more compensation receiving positions may be identified on the first or second frame part at which a compensation magnet, being a permanent magnet or a powered electric coil, can be placed. The magnetization value for the compensation magnet required for reducing the magnetic field at the third interference point may then be calculated. By arranging a compensation magnet in accordance with the calculation at the identified compensation receiving position, the magnetic stray field at the third interference point may reduced even further.

Another or additional measure for reducing the magnetic stray field comprises identifying a fourth interference point at which the magnetic field should be minimized. The magnetic field at this position should be correlated with a magnetic field at a fifth interference point. At this fifth interference point, a magnetic field sensor should be arranged. This magnetic field sensor is arranged to measure the magnetic field and to deliver a reading to a controller which drives an electric compensation coil arranged at one of the first and second frame part. The controller drives the electric compensation coil in dependence of the magnetic field at the fourth reference point determined using the magnetic field sensor and the correlation between the magnetic field at the fourth and fifth interference point. Hence, the electric compensation coil can be driven to reduce the magnetic field at the fourth interference point because a correlation exists between this field and the measured magnetic field at a fifth interference point. This arrangement is therefore an active feedback compensation arrangement.

The discrepancy between the fifth and fourth interference point may be required because it is generally not possible to measure at the location for which the magnetic field must be reduced as this is generally within a pathway of charged particles.

The electric compensation coil can form part of the electric coil residing on the first frame part. In that case, the electrical supply arranged for driving the first electric coil is also arranged for compensating the magnetic field at the fourth interference point. It should be noted that the current associated with compensation is relatively small compared to the current required for achieving the desired relative movement.

The electromagnetic actuator is preferably of a Lorentz type in which the Lorentz force on a current carrying element or structure is used to facilitate the relative movement between the first and second frame part. Furthermore, the first frame part preferably comprises a plurality of electric coils. In this case, the electrical supply is arranged to drive the plurality of electric coils synchronously. By this synchronous drive the electric coils can traverse the multiple pole arrangements fully thereby extending the range of motion.

Preferably, guiding means are provided for guiding the first and or second frame part. For instance, the second frame part could be arranged stationary. In this case, the first frame part is the only moving part. A rail structure could be arranged for guiding the first frame part. Such a rail structure could be connected to the second frame part, but is should be noted that in most cases the first and second frame parts do not make mechanical contact.

The second frame part may form a U-shaped channel to which the first frame part can be moveably coupled. Typically, the U-shaped channel is formed by two parallel elongated plate members of ferromagnetic material that are spaced apart by a mechanical connection. The channel formed in between these elongated plates is adapted for at least partly receiving the first frame part. In turn, the first frame part may also comprise an elongated plate member. The one or more electric coils are arranged on this plate.

Although explicitly mentioned, it should be obvious to the skilled person that the use of the terminology first, second, third, fourth, and fifth interference point, does not exclude the possibility that one or more of these points are identical. This is further strengthened by the fact that these points all relate to a common objective, i.e. to reduce the magnetic stray field, especially for points which would later coincide with a pathway of charged particles.

Although described as separate measures, most measures should in practical situations be combined to achieve the necessary reduction of the magnetic stray field. In particular, the allocation optimization can be combined with either or both of the compensation magnet arrangement and the active feedback compensation arrangement.

A preferred design approach is to first design the electromagnetic actuator using nominal magnetization values for the permanent magnets. At this stage also the receiving positions for these magnets are determined as well as most of the structural properties of the first and second frame part. Then, the end magnet arrangement can be applied for reducing the effects of the finite arrangement of the pole pattern. The allocation of the permanent magnets, and the end magnets if needed, can then be optimized. As a next step, the magnetic field can be compensated using one or more compensation magnets as described above. This leaves the active feedback compensation arrangement to achieve the final reduction of the magnetic stray field. It should be obvious to the skilled person that other selections of measures or arrangements are possible depending on the required suppression of the magnetic stray field and the type of electromagnetic actuator.

The present invention further provides a charged particle device suitable for use in the process of fabricating electronic circuitry. The term process in this text should be interpreted broadly as meaning any act, treatment or processing step related to the fabrication of electronic circuitry. Examples of such process are inspection, etching, patterning, metal evaporation, etc. Furthermore, a charged particle device is not restricted to electronic circuitry. For instance, SEM is also used to analyze biological tissue. The invention should therefore not be restricted as such.

According to the invention, the charged particle device is characterized in that the holding unit is mechanically coupled to an electromagnetic actuator as obtained by applying the method as previously described for allowing movement of the target with respect to the source of charged particles.

Because the electromagnetic actuator has a reduced magnetic stray field it now becomes possible to directly attach the holding unit to either the first or second frame part of the electromagnetic actuator unlike prior art systems. Consequently, the holding unit is able to move faster and more accurately than known systems.

The aforementioned first, second, third, fourth, and fifth interference point could each correspond to a point inside a pathway of the charged particles from the source of the particles to the target. Some of these points could coincide.

Examples of a charged particle device are an electron microscopy apparatus, an electron beam writer, a wafer stepper, or a charged beam deposition or etching apparatus such as a focused ion beam etching device. Possible applications are electron beam wafer inspection, electron beam and ion beam lithography, both mask less and mask free.

The present invention further provides an electromagnetic actuator which is characterized in that the allocation of the permanent magnets to the receiving positions is in accordance with the optimized allocation as defined in claim 1.

BRIEF DESCRIPTION OF THE DRAWINGS

Next, the present invention will be described in more detail using the appended figures in which.

DETAILED DESCRIPTION

Figure 1:
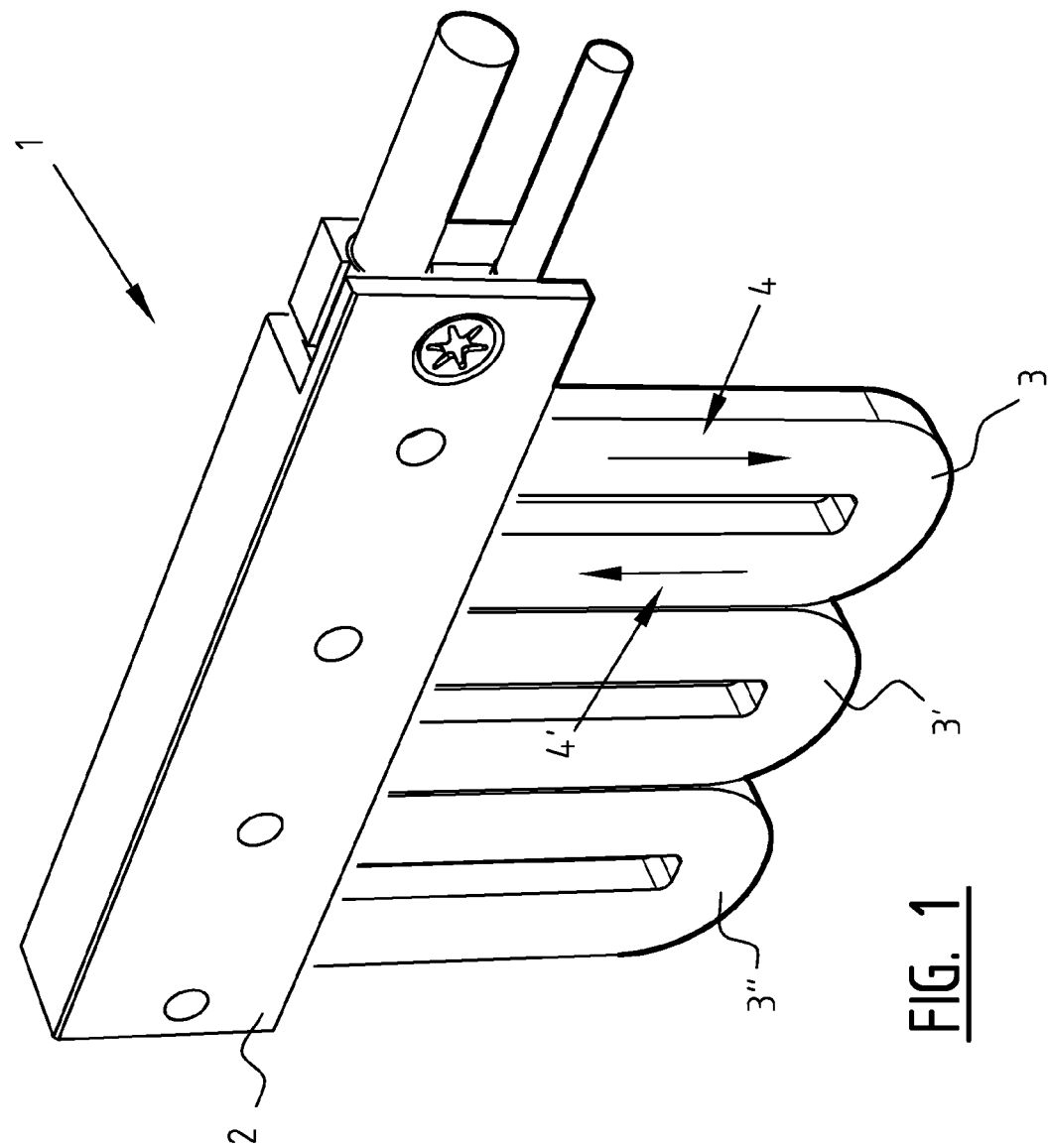
FIG. 1 illustrates an embodiment of a first frame part of a linear synchronous motor (LSM) according to the present invention.
Figure 2:
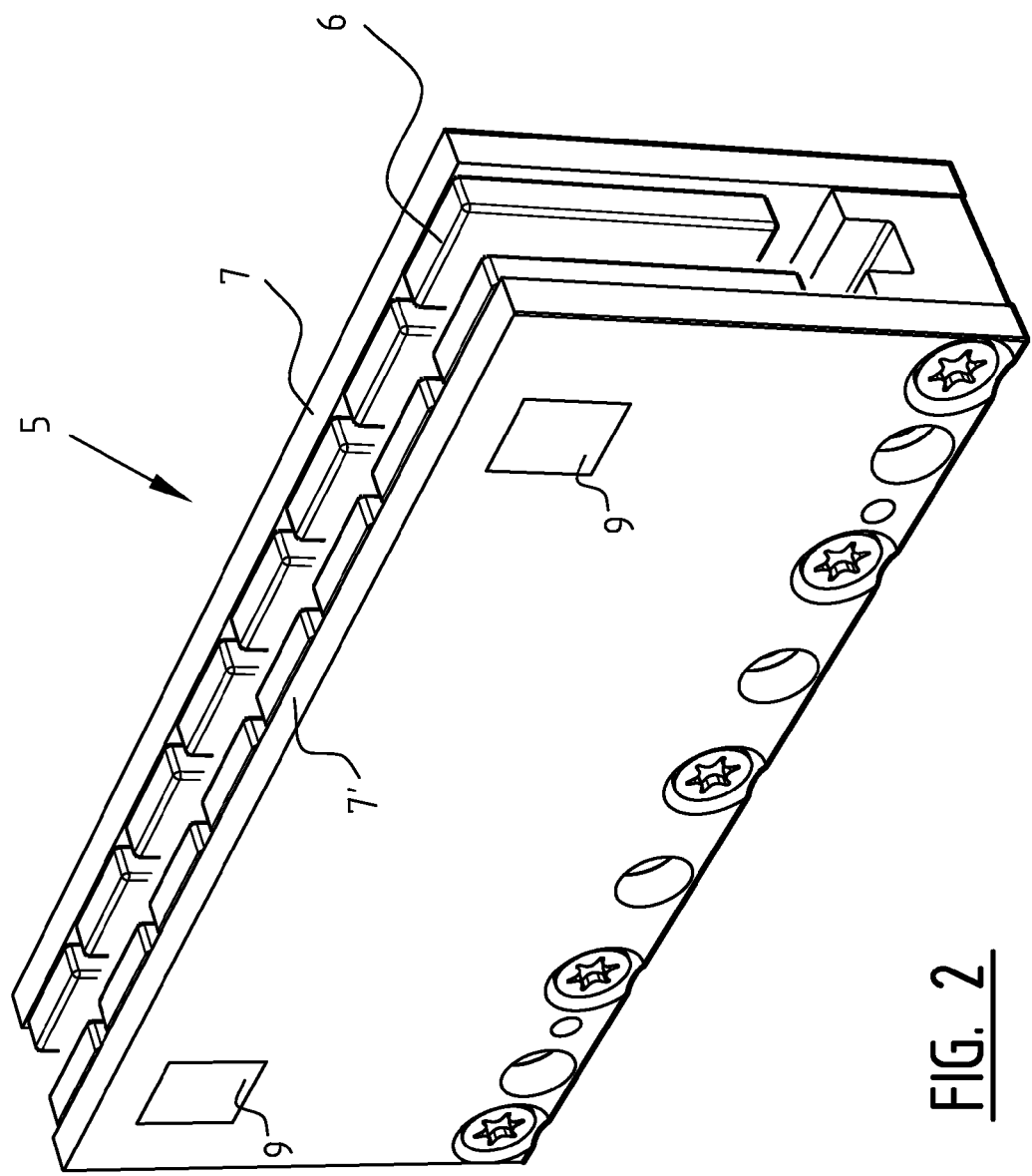
FIG. 2 shows an embodiment of a second frame part of a linear synchronous motor (LSM) according to the present invention.
Figure 4:
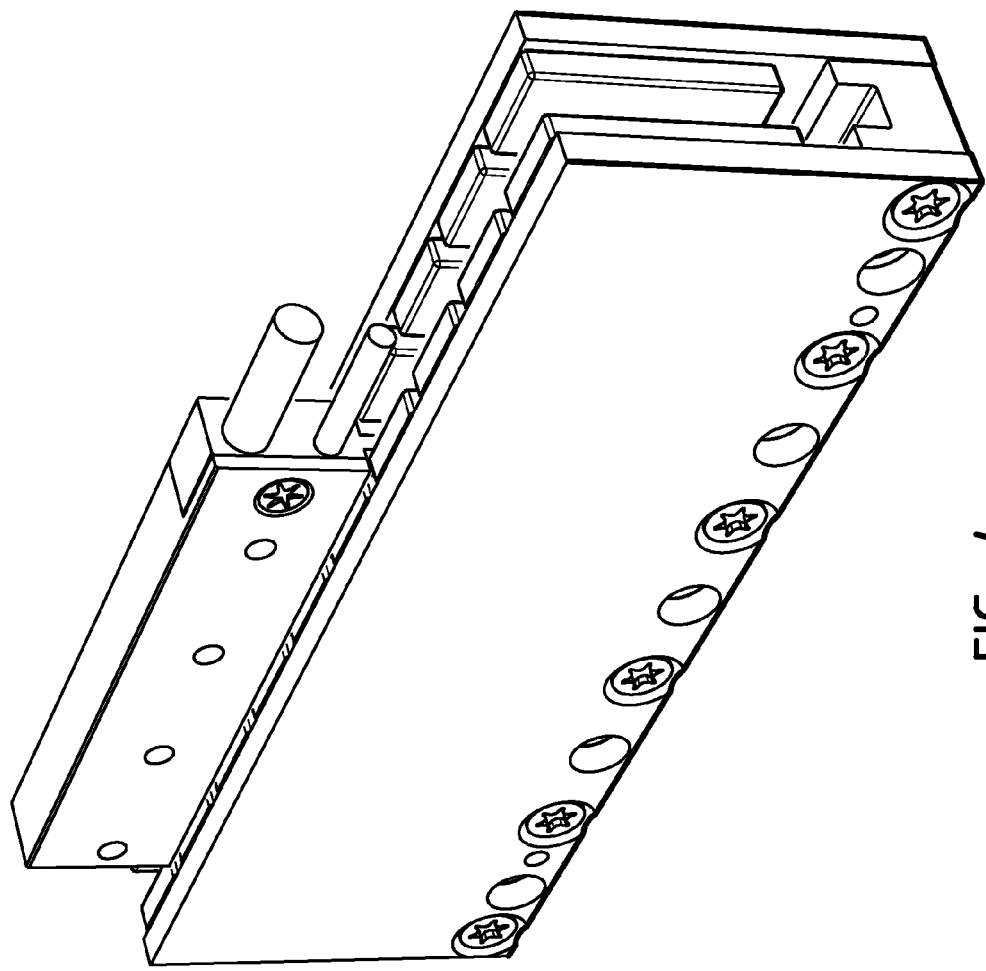
FIG. 4 illustrates the first and second frame part coupled to each other.

A linear synchronous motor (LSM) typically comprises a first and second frame part. Embodiments of these parts are shown in FIGS. 1 and 2, respectively. First part 1 comprises a elongated plate member 2. A number of electric coils 3-3" are connected to plate member 2. Typically, coils 3-3" are shielded by a cover plate which is not shown in FIG. 1. Coils 3-3" carry a current of which the direction at a given time instant is indicated by arrows 4, 4'. The second frame part 5, illustrated in FIG. 2, comprises a plurality of permanent magnets 6. These magnets are received at predefined receiving positions on two elongated plate members 7, 7' comprising ferromagnetic material such as iron. These plates serve to guide the magnetic flux and act as magnetic shielding. U-shaped mechanical connection 8 is used to keep plate members 7, 7' at a constant distance from each other. It also provides a groove in which first frame part 1 can move. FIG. 4 shows how the first and second frame part can be coupled.

Figure 3:
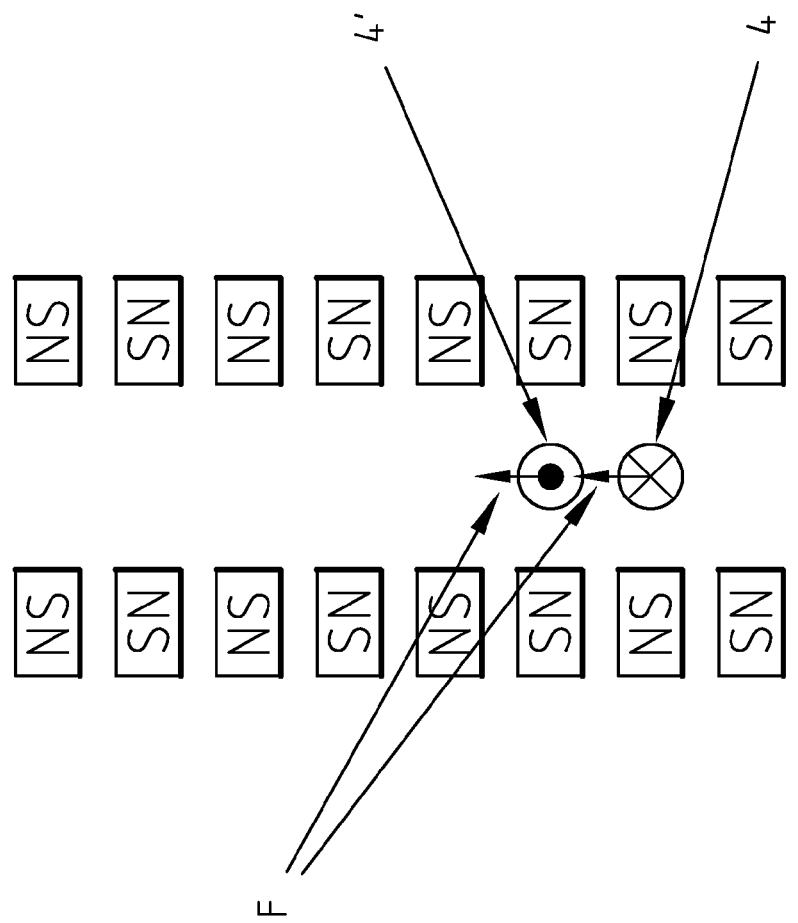
FIG. 3 shows a pole pattern corresponding to the second frame part of FIG. 2.

In order to explain how the relative movement is generated, FIG. 3 is used which illustrates a top side view of the pole pattern of the permanent magnets in the second frame part. Also shown is coil 3 from FIG. 1 which resides in between two permanent magnets 6. Because the Lorentz force acting on the current carrying coil 3 has the same direction due to the opposite current directions indicated by arrows 4, 4', a net force on coil 3 will result facilitating a relative movement between the first and second frame part along direction F. In the case of FIGS. 1-3, second frame part 5 is kept stationary and first frame part 1 is allowed to move along the longitudinal direction of second frame part 5. Please note that this direction corresponds to the direction in which the pole pattern alternates.

Coils 3-3" are driven by an electrical supply (not shown) which is arranged to drive each coil synchronously with an alternating current and or time-varying current at a different phase. This allows first frame part 1 to move through the alternating pole pattern instead of being stuck to one pair of permanent magnets 6.

To reduce the magnetic stray field the outer 4 permanent magnets, the so called end magnets arranged at the corners of second frame part 5, preferably have a different magnetization value than the other permanent magnets to account for the end effects of the magnetic arrangement. The allocation of the end magnets and the other permanent magnets can be optimized by exchanging positions. Herein, the inner 12 magnets can exchange position with each other, as well as the outer 4 magnets.

Also shown in FIG. 2 is the location of 4 additional compensation magnets, which in FIG. 2 are in the form of permanent magnets 9. One or more of the electric coils 3-3" could be used for achieving the active feedback compensation.

Figure 5:
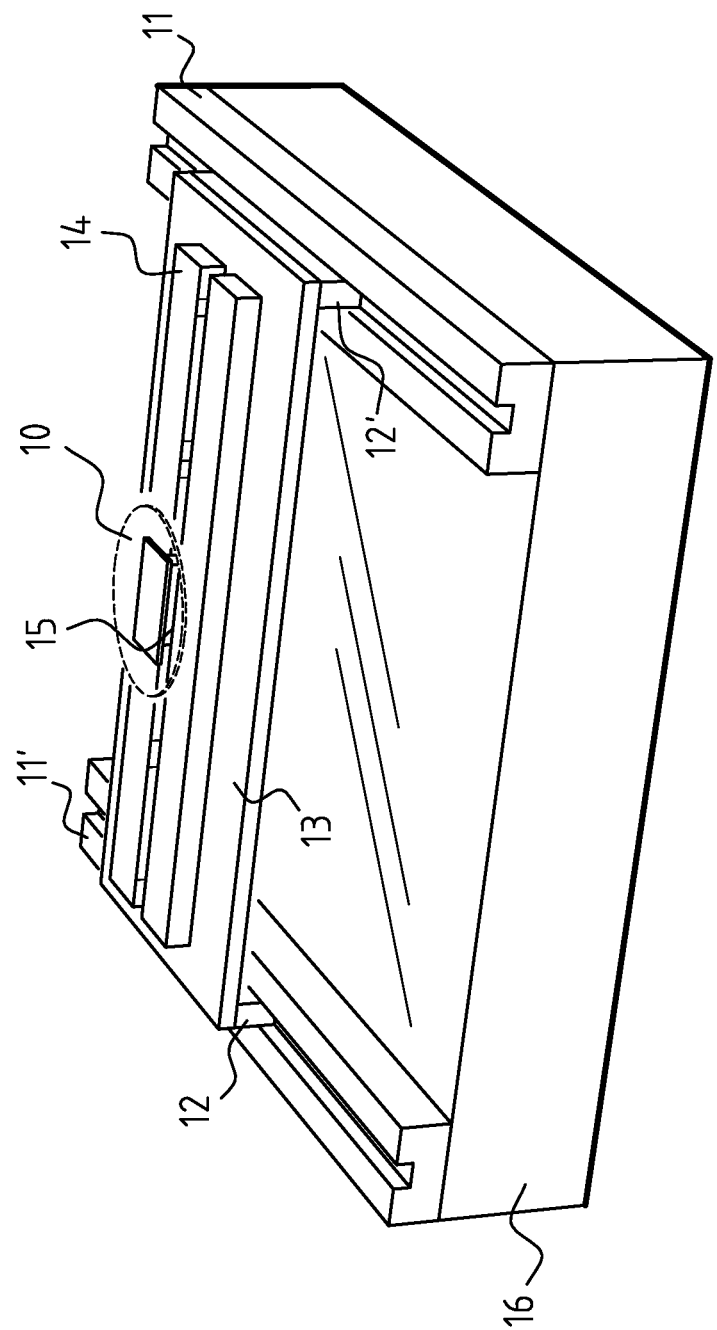
FIG. 5 schematically illustrates an embodiment of a H-drive configuration for a charged particle device according to the present invention comprising a plurality of linear motors as illustrated in FIG. 3.

FIG. 5 illustrates a so-called H-drive used for moving a holding unit in the form of a wafer holder 10. The H-drive comprises two second frame parts 11, 11' which are arranged parallel and in between which first frame parts 12, 12' are arranged which are mechanically coupled by a plate 13. Another linear synchronous motor is arranged on plate 13. It also comprises a second frame part 14 and a first frame part 15, the latter of which is directly coupled to wafer holder 10. The entire apparatus is placed on a supporting frame 16. In case of a SEM, it should be obvious that any magnetic field above wafer holder 10 would interfere with the electron beam. Using the electromagnetic actuators of the present invention strongly reduces the magnetic field at that point. As a result, the SEM is able to operate at higher speeds while maintaining the accuracy and resolution of non-magnetic solutions. A SEM equipped with an electromagnetic actuator according to the present invention can therefore be used for production scale device inspection.

It should be obvious to the skilled person in the art that various modifications are possible for the embodiments shown without deviating from the scope of the invention which is defined in the appended claims.

The invention claimed is:

1. A method for fabricating an electromagnetic actuator, comprising:
   providing a plurality of permanent magnets each having a nominal magnetization value which is subjected to tolerance;
   providing a first frame part having an electric coil; providing an electrical supply for driving the electric coil;
   providing a second frame part having a plurality of predefined receiving positions for receiving the plurality of permanent magnets;
   arranging the plurality of permanent magnets at the plurality of receiving positions for obtaining a magnetic arrangement having an alternating pole pattern in a first direction;
   coupling the first and second frame part;
   wherein the first and second frame part are arranged to allow relative movement between them along the first direction as a result of driving the electric coil; characterized by
   computing a correlation between an allocation of each of the plurality of permanent magnets to the plurality of receiving positions and the magnetic field at a first predefined interference point;
   optimizing the allocation with respect to a predetermined maximum value of the magnetic field at the first interference point using the correlation;
   arranging each permanent magnet to a receiving positions using the optimized allocation.

2. The method according to claim 1, wherein the correlation and allocation take into account an orientation of each permanent magnet at a corresponding receiving position.

3. The method according to claim 1, wherein the nominal values for the magnetization of the plurality of permanent magnets are equal and wherein the correlation relates the magnetic field at the first interference point to determined differences between this nominal value and the actual value for the magnetization of each of the plurality of permanent magnets.

4. The method according to claim 3, wherein computing the correlation comprises linearizing the magnetic field at the first interference point with respect to a difference from the nominal value at each of the receiving positions.

5. The method according to claim 1, further comprising:
calculating a magnetic field at a second predefined interference point using the nominal values for the magnetization of the plurality of permanent magnets;
identifying an end receiving position on the first or second frame part for placement of an end magnet;
calculating the required magnetization value for the end magnet for reducing the magnetic field at the second interference point;
arranging an end magnet having a magnetization value in accordance with the calculated magnetization value for the end magnet at the identified end receiving position.

6. The method according to claim 5, wherein a plurality of end magnets is allocated to a plurality of end receiving positions, said method further comprising:
computing a correlation between an allocation of each of the plurality of end magnets to the plurality of end receiving positions and the magnetic field at the first predefined interference point;
optimizing the allocation with respect to a predetermined maximum value of the magnetic field at the first interference point using the correlation for the end magnets;
arranging each end magnet to a end receiving position using the optimized allocation for the end magnets.

7. The method according to claim 6, wherein the optimization of the allocation for the end magnets is performed simultaneously to the optimization of the allocation for the permanent magnets.

8. The method according to claim 5, further comprising:
measuring a magnetic field at a third interference point;
identifying a compensation receiving position on the first or second frame part for placement of a compensation magnet;
calculating the required magnetization value for the compensation magnet for reducing the magnetic field at the third interference point; and
arranging a compensation magnet having a magnetization value in accordance with the calculated magnetization value for the compensation magnet at the identified compensation receiving position.

9. The method according to claim 8, further comprising:
identifying a fourth interference point at which the magnetic field should be minimized;
correlating the magnetic field at the fourth interference point to a magnetic field at a fifth interference point;
arranging a magnetic field sensor at the fifth reference point;
arranging a electric compensation coil at one of said first and second frame part; and
providing a controller for driving said electric compensation coil in dependence of the magnetic field at the fourth reference point determined using the magnetic field sensor and the correlation between the magnetic field at the fourth and fifth interference point.

10. The method according to claim 9, wherein the electric compensation coil forms part of the electric coil.

11. The method according to claim 1, wherein the electromagnetic actuator motor is of a Lorentz type.

12. The method according to claim 1, wherein the first frame part comprises a plurality of electric coils, and wherein the electrical supply is arranged to drive the plurality of electric coils synchronously.

13. The method according to claim 1, further comprising providing guiding means for guiding said first and or second frame part.

14. The method according to claim 1, wherein the second frame part forms a U-shaped channel in which the first frame part can at least be partly received.

15. The method according to claim 14, wherein the U-shaped channel is formed by two parallel elongated plate members of ferromagnetic material that are spaced apart by a mechanical connection, wherein the first frame part comprises an elongated plate member onto which the electric coil is arranged.

16. The method according to claim 9, wherein at least two of the first, second, third, fourth, and fifth interference point, are identical.

17. The method according to claim 5, further comprising:
measuring a magnetic field at a third interference point; and
identifying a compensation receiving position on the first or second frame part for placement of a compensation magnet.

18. The method according to claim 17, further comprising:
calculating the required magnetization value for the compensation magnet for reducing the magnetic field at the third interference point; and
arranging a compensation magnet having a magnetization value in accordance with the calculated magnetization value for the compensation magnet at the identified compensation receiving position.

19. The method according to claim 18, further comprising:
identifying a fourth interference point at which the magnetic field should be minimized;
correlating the magnetic field at the fourth interference point to a magnetic field at a fifth interference point;
arranging a magnetic field sensor at the fifth reference point; and
arranging a electric compensation coil at one of said first and second frame part.

20. The method according to claim 19, further comprising:
providing a controller for driving said electric compensation coil in dependence of the magnetic field at the fourth reference point determined using the magnetic field sensor and the correlation between the magnetic field at the fourth and fifth interference point.

21. Charged particle device suitable for use in the process of fabricating electronic circuitry, comprising:
a source of charged particles arranged to release said charged particles towards a target arranged at a distance from said source;
a moveable holding unit for holding the target; characterized in that the holding unit is mechanically coupled to an electromagnetic actuator as obtained by applying the method according to claim 1, for allowing movement of the target with respect to the source of charged particles
wherein the holding unit is directly attached to either the first or second frame part of the electromagnetic actuator wherein at least one of said first, second, third, fourth, and fifth interference point corresponds to a point inside a pathway of the charged particles from the source of the particles to the target.

22. The charged particle device according to claim 21, wherein the device is an electron microscopy apparatus, an electron beam writer, a wafer stepper, or a charged beam deposition or etching apparatus such as a focused ion beam etching device.

23. An electromagnetic actuator, comprising:
a first frame part having an electric coil;
an electrical supply for driving the electric coil; a second frame part having a plurality of predefined receiving positions to which a plurality of permanent magnets is allocated and arranged for obtaining a magnetic arrangement having an alternating pole pattern in a first direction, wherein each of said plurality of permanent magnets has a nominal magnetization value subjected to tolerance;
wherein the first and second frame part are coupled and arranged to allow relative movement between them along the first direction as a result of driving the electric coil; characterized in that the allocation of the permanent magnets to the receiving positions is in accordance with the optimized allocation as defined in claim 1.

* * * * *